United States Patent
Fujita

(10) Patent No.: US 8,420,190 B2
(45) Date of Patent: Apr. 16, 2013

(54) PACKAGING MATERIAL FOR PACKAGING OF CONTAINER HAVING PHOTOSENSITIVE COMPOSITION FILLED THEREIN

(75) Inventor: Mahito Fujita, Sakai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 83 days.

(21) Appl. No.: 12/999,497

(22) PCT Filed: Jun. 24, 2009

(86) PCT No.: PCT/JP2009/062023
§ 371 (c)(1),
(2), (4) Date: Dec. 16, 2010

(87) PCT Pub. No.: WO2010/001915
PCT Pub. Date: Jan. 7, 2010

(65) Prior Publication Data
US 2011/0168596 A1    Jul. 14, 2011

(30) Foreign Application Priority Data
Jul. 1, 2008    (JP) .................. 2008-172137

(51) Int. Cl.
*B29D 22/00*    (2006.01)
(52) U.S. Cl.
USPC ....... 428/34.1; 428/35.7; 428/34.2; 428/34.6; 428/34.7; 53/396
(58) Field of Classification Search ........... 428/35.7, 428/34.1, 34.6, 34.7; 53/396
See application file for complete search history.

(56) References Cited

U.S. PATENT DOCUMENTS

| 6,465,062 B2 * | 10/2002 | Cook et al. ............... 428/34.4 |
| 6,613,036 B1 * | 9/2003 | Farmer et al. ............. 604/408 |
| 6,974,611 B2 * | 12/2005 | Sakatani et al. ........... 428/34.1 |
| 2002/0110654 A1 | 8/2002 | Cook et al. |
| 2011/0168596 A1 * | 7/2011 | Fujita ................... 206/459.5 |
| 2011/0245276 A1 * | 10/2011 | Takahashi et al. ......... 514/262.1 |

FOREIGN PATENT DOCUMENTS

| EP | 1375602 A1 | 1/2004 |
| JP | 61-126548 A | 6/1986 |
| JP | 5-27375 A | 2/1993 |
| JP | 5-119439 A | 5/1993 |
| JP | 10-172881 A | 6/1998 |
| JP | 2001-281804 A | 10/2001 |
| JP | 2004-529003 A | 9/2004 |
| JP | 2005-87570 A | 4/2005 |
| WO | WO 01/56895 A2 | 8/2001 |

OTHER PUBLICATIONS

International Search Report, dated Aug. 18, 2009, issued in PCT/JP2009/062023.
International Preliminary Report on Patentability and Translation of Written Opinion of the International Searching Authority, dated Feb. 17, 2011, for International Application No. PCT/JP2009/062023 (Forms PCT/IB/338, PCT/IB/373 and PCT/ISA/237).

* cited by examiner

*Primary Examiner* — N. Edwards
(74) *Attorney, Agent, or Firm* — Birch, Stewart, Kolasch & Birch, LLP

(57) ABSTRACT

A packaging material for packaging a container having a photosensitive composition filled therein, which comprises a film having a transmittance of a light in a wavelength range of 200 nm to 500 nm of 5% or less and a transmittance of a light in a wavelength range of 620 nm to 940 nm of 10% or more.

11 Claims, 2 Drawing Sheets

PACKAGING MATERIAL FOR PACKAGING OF CONTAINER HAVING PHOTOSENSITIVE COMPOSITION FILLED THEREIN

TECHNICAL FIELD

The present invention relates to a packaging material for packaging of a container having a photosensitive composition filled therein.

BACKGROUND ART

A photosensitive composition such as a photoresist composition is usually filled in a container such as a gallon bottle as described in FIG. 3 of JP H10-172881 A. A label in which the information about the photosensitive composition filled therein such as name, kind, lot number, manufacturing company and date of packing has been recorded is usually attached to the above-mentioned container, and however the above-mentioned container is usually packaged with a black bag in order to prevent the photosensitive composition from being leaked by a break of the container and in order to inhibit a deterioration of the photosensitive composition, and therefore, it is necessary to check the label attached to the container by removing the package to obtain the information about the photosensitive composition filled therein for managing the container obtained.

Alternatively, on the black bag, a label on which the information about the photosensitive composition filled in the container in the bag has been recorded is often attached, and in that case, it is necessary to check whether the label attached on the bag is the same as that attached to the container or not, and when both labels are different, the work for checking which label is correct is needed.

BRIEF SUMMARY OF THE INVENTION

The present invention provides:
<1> A packaging material for packaging a container having a photosensitive composition filled therein, which comprises a film having a transmittance of a light in a wavelength range of 200 nm to 500 nm of 5% or less and a transmittance of a light in a wavelength range of 620 nm to 940 nm of 10% or more;
<2> The packaging material according to <1>, wherein the transmittance of a light in a wavelength range of 620 nm to 940 nm is 30% or more;
<3> The packaging material according to <1>, wherein the transmittance of a light in a wavelength range of 620 nm to 940 nm is 50% or more;
<4> The packaging material according to any one of <1> to <3>, wherein the film is a film comprising a transparent resin and a yellow dye;
<5> The packaging material according to <4>, wherein the film further comprises an ultraviolet absorber;
<6> The packaging material according to any one of <1> to <5>, wherein the packaging material is a bag packaging material;
<7> A container having a photosensitive composition filled therein, which is packaged with the packaging material according to any one of <1> to <6>;
<8> The container having a photosensitive composition filled therein according to <7>, wherein a label in which the information about the photosensitive composition filled in the container has been recorded is attached on the outside surface of the container having a photosensitive composition filled therein;
<9> The container having a photosensitive composition filled therein according to <8>, wherein the information about the photosensitive composition filled in the container is bar-code;
<10> Use of a packaging material comprising a film having a transmittance of a light in a wavelength range of 200 nm to 500 nm of 5% or less and a transmittance of a light in a wavelength range of 620 nm to 940 nm of 10% or more for packaging a container having a photosensitive composition filled therein;
<11> A method for packaging a container having a photosensitive composition filled therein, which comprises packaging the container having a photosensitive composition filled therein with a packaging material comprising a film having a transmittance of a light in a wavelength range of 200 nm to 500 nm of 5% or less and a transmittance of a light in a wavelength range of 620 nm to 940 nm of 10% or more;
<12> A method for storing a photosensitive composition comprising packaging a container having the photosensitive composition filled therein with a packaging material comprising a film having a transmittance of a light in a wavelength range of 200 nm to 500 nm of 5% or less and a transmittance of a light in a wavelength range of 620 nm to 940 nm of 10% or more, and storing the above-mentioned container packaged.

BEST MODE FOR CARRYING OUT THE PRESENT INVENTION

Figure 1:
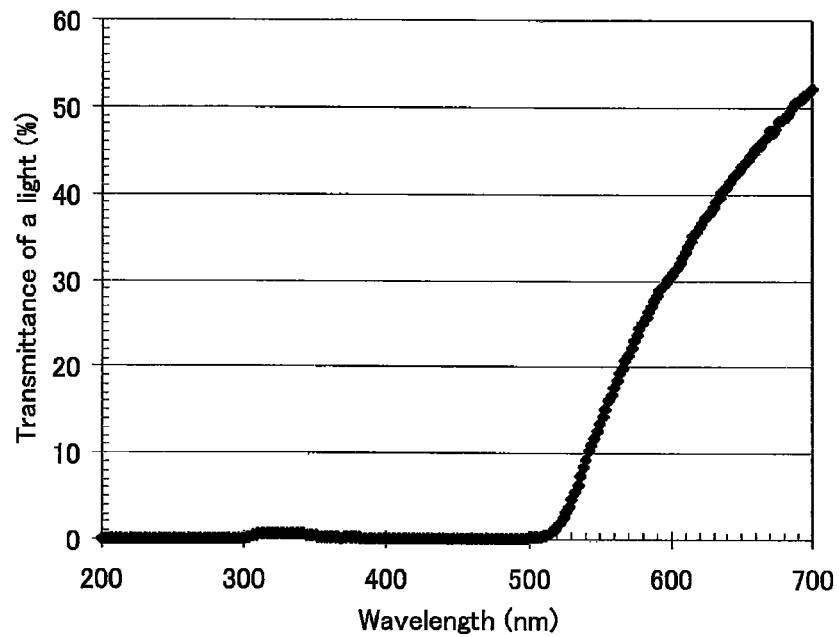
FIG. 1 A graph showing a transmittance of a light of the film used in Example 2

The packaging material for packaging a container having a photosensitive composition filled therein of the present invention comprises a film having a transmittance of a light in a wavelength range of 200 nm to 500 nm of 5% or less and a transmittance of a light in a wavelength range of 620 nm to 940 nm of 10% or more. It is preferred that the transmittance of a light in a wavelength range of 620 nm to 940 nm is 15% or more, it is more preferred that the transmittance of a light in a wavelength range of 620 nm to 940 nm is 30% or more, and it is especially preferred that the transmittance of a light in a wavelength range of 620 nm to 940 nm is 50% or more.

Hereinafter, the transmittance of a light can be measured according to the test method of the total transmittance of a light prescribed in JIS K7361.

The main component of the above-mentioned film is usually a transparent resin. Examples of the transparent resin include polypropylene-typed resins such as polypropylene homopolymer, propylene/ethylene copolymer and propylene/ethylene/α-olefin terpolymer; ethylene-typed resins such as high density polyethylene (HD-PE), low density polyethylene (LD-PE), linear low density polyethylene (LL-DPE), ethylene/vinyl acetate copolymer, ethylene/methyl methacrylate copolymer and ethylene/vinyl alcohol copolymer resin; methylpentene polymer; polystyrene-typed resins such as polystyrene, acrylonitrile/styrene copolymer, styrene/butadiene copolymer, styrene/acrylonitrile/butadiene terpolymer, high-impact polystyrene, poly(p-methylstyrene) and poly(α-methylstyrene); polychloroprene; chlorinated rubber; polyvinyl chloride; polyvinylidene chloride; methacrylic resin; fluorine resin; polyacetal; grafted polyphenylene ether resin; polyphenylene sulfide resin; polyurethane; polyamide; polyester resins such as polyethylene terephthalate and polybutyrene terephthalate; polycarbonate; acrylic resin; polysulfone; polyether ether ketone; polyether sulfone; aromatic polyester resin; diallyl phthalate prepolymer; silicone resin; and 1,2-polybutadiene; polyisoprene; butadiene/acrylonitrile copolymer. Among them, preferred are polyethylene resin, polypropylene resin and polystyrene resin from the viewpoint of good molding workability.

The film used for the present invention has a transmittance of a light in a wavelength range of 200 nm to 500 nm of 5% or less, preferably of 2% or less and more preferably of 1% or less.

Examples of the film include those in which a yellow dye is arbitrarily contained.

The yellow dyes, that may be used, include those capable of being kneaded into the transparent resin. Specific examples thereof include OIL YELLOW 105 (trade name, manufactured by Orient Chemical Industries Co., Ltd.), OIL YELLOW 107 (trade name, manufactured by Orient Chemical Industries Co., Ltd.), OIL YELLOW 129 (trade name, manufactured by Orient Chemical Industries Co., Ltd., C.I. Solvent Yellow 29), OIL YELLOW 3G (trade name, manufactured by Orient Chemical Industries Co., Ltd., C.I. Solvent Yellow 16), OIL YELLOW GG-S (trade name, manufactured by Orient Chemical Industries Co., Ltd., C.I. Solvent Yellow 56), VALIFAST YELLOW 1101 (trade name, manufactured by Orient Chemical Industries Co., Ltd.), VALIFAST YELLOW 1105 (trade name, manufactured by Orient Chemical Industries Co., Ltd.), VALIFAST YELLOW 4120 (trade name, manufactured by Orient Chemical Industries Co., Ltd., C.I. Solvent Yellow 82), Oleosol Brilliant Yellow 5G (trade name, manufactured by Taoka Chemical Co., Ltd., C.I. Solvent Yellow 150), Oleosol Fast Yellow 2G (trade name, manufactured by Taoka Chemical Co., Ltd., C.I. Solvent Yellow 21), Oleosol Brilliant Yellow GCN (trade name, manufactured by Taoka Chemical Co., Ltd., C.I. Solvent Yellow 151), Aizen Sot Yellow 1 (trade name, manufactured by Hodogaya Chemical Co., Ltd., C.I. Solvent Yellow 56), Aizen Sot Yellow 3 (trade name, manufactured by Hodogaya Chemical Co., Ltd., C.I. Solvent Yellow 16), Aizen Sot Yellow 6 (trade name, manufactured by Hodogaya Chemical Co., Ltd., C.I. Solvent Yellow 33), Aizen Spilon Yellow GRLH (trade name, manufactured by Hodogaya Chemical Co., Ltd.), Aizen Spilon Yellow 3RH (trade name, manufactured by Hodogaya Chemical Co., Ltd.), Orasol Yellow 2GLN (trade name, manufactured by Ciba-Geigy, C.I. Solvent Yellow 88), Orasol Yellow 2RLN (trade name, manufactured by Ciba-Geigy, C.I. Solvent Yellow 89), Orasol Yellow 3R (trade name, manufactured by Ciba-Geigy, C.I. Solvent Yellow 25), Oracet Yellow GHS (trade name, manufactured by Ciba-Geigy, C.I. Solvent Yellow 163) and FILAMID Yellow R (trade name, manufactured by Ciba-Geigy, C.I. Solvent Yellow 21).

The film used for the present invention may contain pigments or dyes other than yellow dyes such as black dyes as far as it is a film having a transmittance of a light in a wavelength range of 200 nm to 500 nm of 5% or less and a transmittance of a light in a wavelength range of 620 nm to 940 nm of 10% or more.

The film used for the present invention may further contain an ultraviolet absorber. Examples of the ultraviolet absorber include benzotriazole-typed ultraviolet absorbers, salicylate-typed ultraviolet absorbers, benzothiazol-typed ultraviolet absorbers, cyanoacrylate-typed ultraviolet absorbers, azo-typed ultraviolet absorbers, polyene-typed ultraviolet absorbers, anthraquinone-typed ultraviolet absorbers and hindered amine-typed ultraviolet absorbers. Examples of the benzophenone-typed ultraviolet absorbers include 2,4-dihydroxybenzophenone, 2,2',4,4'-tetrahydroxybenzophenone, 2-hydroxy-4-methoxybenzophenone, 2,2'-dihydroxy-4-methoxybenzophenone, 2,2'-dihydroxy-4,4'-dimethoxybenzophenone, 2-hydroxy-4-n-octyloxybenzophenone, 2-hydroxy-4-methoxy-2'-carboxybenzophenone, 2-hydroxy-4-octade cyloxybenzophenone, 4-dodecyloxy-2-hydroxybenzophenone, 2-hydroxy-4-(2-hydroxy-3-methacryloxy)propoxybenzophenone, N,N'-tetramethyl-4,4'-diaminobenzophenone, 2-hydroxybenzophenone, 4-hydroxybenzophenone, 4,4'-dihydroxybenzophenone, 2,3,4-trihydroxybenzophenone, 2,4,5-trihydroxybenzophenone, 2,4,6-trihydroxybenzophenone, 2,4,4'-trihydroxybenzophenone, 2,2',3,4-tetrahydroxybenzophenone, 2,3,4,4'-tetrahydroxybenzophenone, 2,2',3,4,4'-pentahydroxybenzophenone and 2,3,3',4,4',5'-hexa hydroxybenzophenone.

Examples of the salicylate-typed ultraviolet absorbers include phenyl salicylate, p-tert-butylphenyl salicylate and p-octylphenyl salicylate. Examples of the benzotriazole-typed ultraviolet absorbers include 2-(2-hydroxy-5-methylphenyl)benzotriazole, 2-(2-hydroxy-5-tent-butylphenyl) benzotriazole, 2-(2-hydroxy-3,5-di-tert- butylphenyl) benzotriazole, 2-(2-hydroxy-3-tert-butyl-5-methylphenyl)-5-chlorobenzotriazole, 2-(2-hydroxy-3,5-di-tert-butylphenyl)-5-chlorobenzotriazole and 2-(2-hydroxy-3,5-di-tert-aminophenyl)benzotriazole. Examples of the cyanoacrylate-typed ultraviolet absorbers include 2-ethylhexyl-2-cyano-3,3-diphenylacrylate and ethyl-2-cyano-3,3-diphenylacrylate.

Examples of the azo-typed ultraviolet absorbers include 4-dimethylamino-4'-hydroxyazobenzene and 1-ethoxy-4-[4-(N,N-diethylamino)phenylazo]benzene. Examples of the polyene-typed ultraviolet absorbers include 4-dimethylamino-4'-hydroxy-3'-nitrostilbene and 4-diethylamino-4'-hydroxy-3'-nitrostilbene. Examples of the anthraquinone-typed ultraviolet absorbers include 1,2,5,8-tetrahydroxyanthraquinone, 1,4,9,10-tetrahydroxyanthraquinone and 1,5-diaminoanthraquinone.

These ultraviolet absorbers may be used singly or two or more kinds thereof may be used in combination.

The film used for the present invention may contain various known additives in the range where the effects of the present invention are not inhibited. Examples of the additives include light stabilizers, antioxidants, metal deactivators, nucleating agents, lubricants, antistats, plasticizers, flame retardants, antiblocking agents, phase transfer agents, processing aids, foaming agents, emulsifiers, calcium stearate, neutralizers such as hydrotalcite and adhesive agents.

As the film used for the present invention, those available as a light shield film for cars, so-called "Yellow Film" may be used.

The thickness of the film is usually 50 μm to 120 μm, and preferably 60 μm to 100 μm.

The packaging material of the present invention may be one wherein the above-mentioned film is cut into the size to be packaged the container having a photosensitive composition filled therein, and may be one formed the above-mentioned film into a bag so that the container is easily packaged therewith. The shape of the packaging material wherein the above-mentioned film is cut into the size to be packaged the container having a photosensitive composition filled therein is not limited, and for example, it may be polygonally shaped such as triangle-shaped and square-shaped, circular, oval, or amorphous. When the packaging material is a bag one, its opening may have a size to be taken the container having a photosensitive composition filled therein in and out, and the shape of the opening is not also limited. Alternatively, the shape of the section of the vertical direction against the opening is not also limited.

The packaging material can be produced according to a method comprising a mixing step of mixing a transparent resin, a yellow dye, and if necessary, an ultraviolet absorber and additives, a kneading step of kneading the mixture obtained in the mixing step with heating, a molding step of molding the resin composition obtained in the kneading step to a film by an inflation method and T die molding method, and as b\necessary, a bag-making step of making a bag by heat-press or cutting of the film obtained in the molding step.

The container having a photosensitive composition filled therein which is packaged with the packaging material of the present invention can be obtained by packaging the container having a photosensitive composition filled therein with the packaging material of the present invention followed by sealing its opening with sealing means such as a band, a tape, a rubber, a heat-sealing and a wire coated with a resin film.

The photosensitive composition is not limited as far as it is a composition containing a photosensitive material such as a photoacid generator and a photopolymerization initiator. Specific examples thereof include a photoresist composition, a photosensitive composition for a photospacer, a photosensitive composition for overcoating, a photosensitive composition for an insulating film, a color resist composition, a composition for a photosensitive element, a composition for black matrix, a photosensitive composition for a separator and a photosensitive composition for a printing plate.

The container used for filling the photosensitive composition therein may be a container made of a transparent glass or a transparent resin, and may be a container made of a glass or synthetic resin colored with brawn or black. The container made of a glass or synthetic resin colored with brawn or black is preferable. Alternatively, the container may be packaged with a paper bag. Specific examples thereof include containers for filling the photosensitive composition therein described in JP H7-330074 A, JP H8-113678 A, JP H08-175555 A, JP H9-95565 A, JP H10-181219 A, JP H11-290420 A, JP H11-314678 A, JP 2007-22610 A, JP 2007-137506 A and JP 2007-197040 A.

To the container, a label in which the information about the photosensitive composition filled therein has been recorded is usually attached. Examples of the information about the photosensitive composition filled therein include a kind of the photosensitive composition, lot number thereof, date of packing thereof, manufacturing company and quality assurance period. This information may be literal information or bar-code, and bar-code is preferable. Alternatively, the label may contain an IC chip in which this information has been recorded.

The container or the label attached to the container can be checked with visual contact without removing the package by packaging a container for filling the photosensitive composition therein with the packaging material of the present invention. Especially, when bar-code is printed on the label attached to the container, bar-code information can be read with a bar-code reader using an infrared ray or the like without removing the package, and the information of the photosensitive composition filled in the container can be easily obtained.

The photosensitive composition can be stored without the deterioration thereof by packaging a container for filling the photosensitive composition therein with the packaging material of the present invention.

Further, even though a photosensitive composition is leaked by a break of the container, the leaking thereof can be checked without removing the package.

EXAMPLES

The present invention will be illustrated by Examples in detail below, but the present invention is not limited to Examples. Meanwhile, in the following Examples, a transmittance of a light was measured according to the test method of the total transmittance of a light prescribed in JIS K7361.

Example 1

Two sheets of yellow film (manufactured by Lintec Corporation, Lumicool 1905, film thickness 80 μm) was overlapped followed by heat-press of its three sides to obtain a bag packaging material.

Into the bag packaging material obtained, a brown glass gallon bottle having a photoresist composition filled therein and attached with a label on which trade name and lot number were described was put. Trade name and lot number were able to be read with visual contact from the outside of the packaging material.

A transmittance of a light of the glass on which yellow film used was attached was measured with an ultraviolet-visual spectrophotometer to find out that maximum transmittance in 280 nm to 500 nm was 1%.

Example 2

A bag packaging material was obtained using yellow film according to the same manner as that in Example 1. The transmittance of a light of the film used was shown in FIG. 1.

Into a brown glass gallon bottle attached with a label, a positive photoresist composition comprising a novolak resin, photosensitizing agent and a solvent was filled and then, the bottle was sealed. The container having the photoresist composition filled therein was packaged with the bag packaging material obtained in the above, and its opening was tied with a wire coated with a resin film to obtain a container having the photoresist composition filled therein and packaged with the packaging material of the present invention. The label attached with the container was able to be read with visual contact without removing the package. Alternatively, bar-code printed on the label was able to be read with a bar-code reader using an infrared ray without removing the package, and the information about the photoresist composition filled in the container was able to be easily obtained.

The same photoresist composition as the above was filled in the other brown glass gallon bottle and then, it was packaged with a black bag.

The container having the photoresist composition filled therein and packaged with the packaging material of the present invention and the container having the photoresist composition filled therein and packaged with the black bag were stored at 23° C. under irradiation of a fluorescent light.

Figure 2:
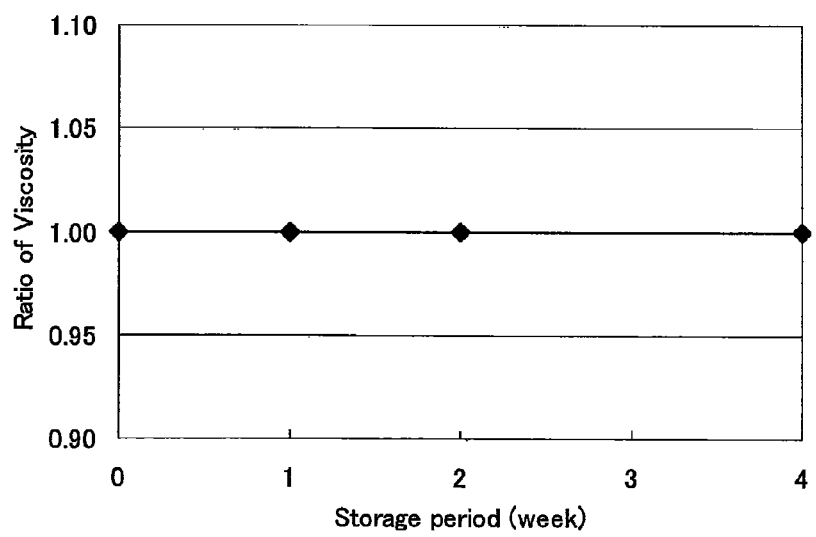
FIG. 2 A graph showing a temporal change of a ratio of a viscosity of a photoresist composition taken from the container having the photosensitive composition filled therein which was packaged with the package of the present invention to a viscosity of a photoresist composition taken from the container having the photosensitive composition filled therein which was packaged with a black bag, which was obtained in Example 2

After starting the storage, a given amount of the photoresist composition was taken from each of the containers per week, its viscosity was measured at 25° C. with a Cannon-Fenske viscometer. A ratio of a viscosity of the photoresist composition taken from the container having the photosensitive composition filled therein and packaged with the package of the present invention to a viscosity of the photoresist composition taken from the container having the photosensitive composition filled therein and packaged with a black bag was calculated, and as the result, the ratio was nearly 1, and it was found that there was not difference in their temporal changes of a viscosity. The results are shown in FIG. 2.

Alternatively, the photoresist composition taken was spin-coated over a silicon wafer treated with hexamethyldisilazane to give a film thickness after drying of 3.9 μm, and then, was prebaked on a direct hotplate. Using a reduced projection exposure system ("NSR-1755i7A" manufactured by Nikon Corporation, NA=0.50, σ=0.5) of which exposing source was 365 nm (i-ray), a line and space pattern was exposed on each of the wafers on which the resist film was formed while changing stepwise the exposure dose.

After the exposure, a post-exposure baking was conducted on a hotplate, and then a development with an aqueous solution of 2.38% by weight tetramethylammonium hydroxide was conducted to obtain a line and space pattern.

The sensitivity was represented as the exposure dose that the film thickness of the space portion of the 1:1 line and space pattern of 50 μm became zero (0).

Figure 3:
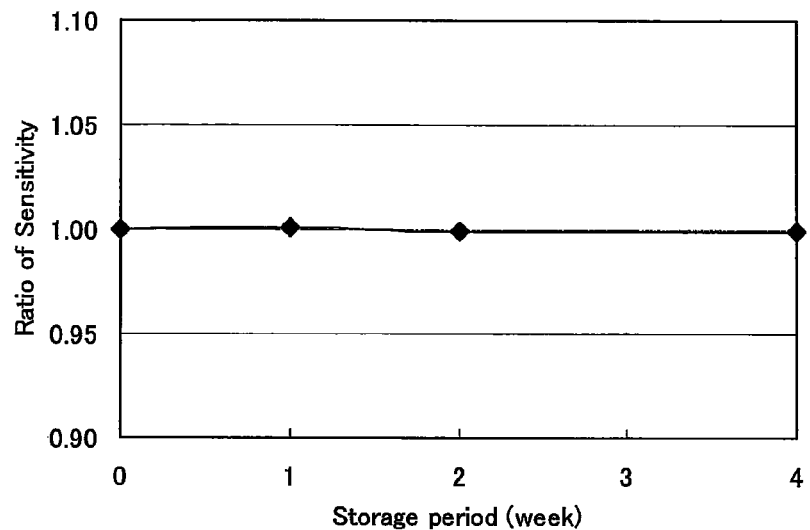
FIG. 3 A graph showing a temporal change of a ratio of a sensitivity of a photoresist composition taken from the container having the photosensitive composition filled therein which was packaged with the package of the present invention to a viscosity of a photoresist composition taken from the container having the photosensitive composition filled therein which was packaged with a black bag, which was obtained in Example 2

A ratio of the sensitivity of the photoresist composition taken from the container having the photosensitive composition filled therein and packaged with the package of the present invention to the sensitivity of the photoresist composition taken from the container having the photosensitive composition filled therein and packaged with a black bag was calculated, and as the result, the ratio was nearly 1, and it was found that there was not difference in their temporal changes of a sensitivity. The results are shown in FIG. 3.

Example 3

Figure 4:
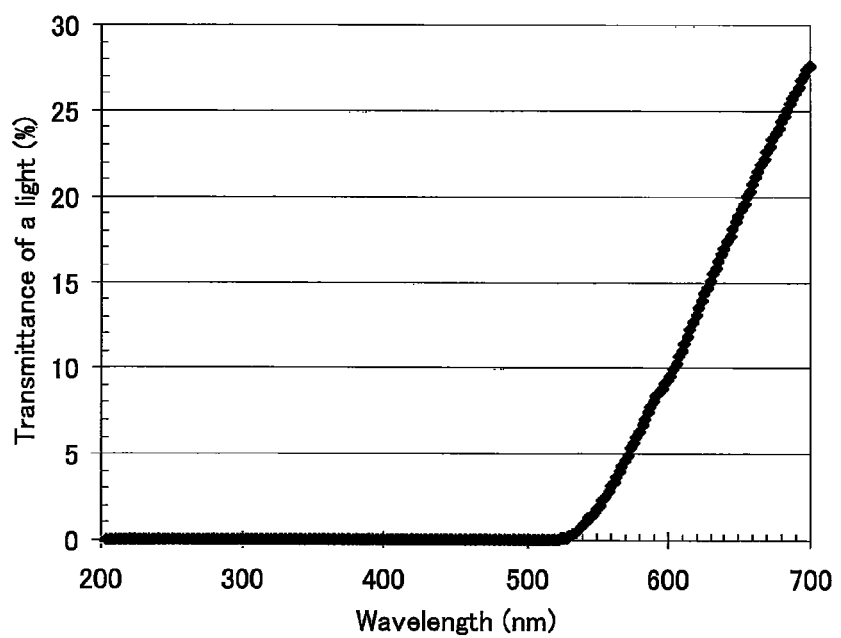
FIG. 4 A graph showing a transmittance of a light of the film used in Example 3

A bag packaging material was obtained using yellow film having a different film thickness according to the same manner as that in Example 1. The transmittance of a light of the film used was shown in FIG. 4.

A brown glass gallon bottle attached with a label was packaged with the bag packaging material obtained in the above. The label attached with the container was able to be read with visual contact without removing the package. Alternatively, bar-code printed on the label was able to be read with a bar-code reader using an infrared ray without removing the package.

INDUSTRIAL APPLICABILITY

By using the packaging material for packaging a container having a photosensitive composition filled therein of the present invention, the packaged container having a photosensitive composition filled therein or the label can be checked with visual contact without removing the package, and therefore, management of containers having photosensitive compositions filled therein can be efficiently conducted in the facilities for producing the photosensitive compositions or the facilities for producing semiconductors.

The invention claimed is:

1. A packaging material for packaging a container having a photosensitive composition filled therein, which comprises a film having a transmittance of a light in a wavelength range of 200 nm to 500 nm of 5% or less and a transmittance of a light in a wavelength range of 620 nm to 940 nm of 10% or more.

2. The packaging material according to claim 1, wherein the transmittance of a light in a wavelength range of 620 nm to 940 nm is 30% or more.

3. The packaging material according to claim 1, wherein the transmittance of a light in a wavelength range of 620 nm to 940 nm is 50% or more.

4. The packaging material according to any one of claims 1 to 3, wherein the film is a film comprising a transparent resin and a yellow dye.

5. The packaging material according to claim 4, wherein the film further comprises an ultraviolet absorber.

6. The packaging material according to claim 1, wherein the packaging material is a bag packaging material.

7. A container having a photosensitive composition filled therein, which is packaged with the packaging material according to claim 1.

8. The container having a photosensitive composition filled therein according to claim 7, wherein a label in which the information about the photosensitive composition filled in the container has been recorded is attached on the outside surface of the container having a photosensitive composition filled therein.

9. The container having a photosensitive composition filled therein according to claim 8, wherein the information about the photosensitive composition filled in the container is bar-code.

10. A method for packaging a container having a photosensitive composition filled therein, which comprises packaging the container having a photosensitive composition filled therein with a packaging material comprising a film haven a transmittance of a light in a wavelength range of 200 nm to 500 nm of 5% or less and a transmittance of a light in a wavelength range of 620 nm to 940 nm of 10% or more.

11. A method for storing a photosensitive composition comprising packaging a container having the photosensitive composition filled therein with a packaging material, comprising a film having a transmittance of a light in a wavelength range of 200 nm to 500 nm of 5% or less and a transmittance of a light in a wavelength range of 620 nm to 940 nm of 10% or more, and storing the above-mentioned container packaged.

* * * * *